United States Patent
Lee

(10) Patent No.: US 6,657,907 B2
(45) Date of Patent: Dec. 2, 2003

(54) COLUMN REPAIR CIRCUIT OF SEMICONDUCTOR MEMORY

(75) Inventor: Hyung Dong Lee, Seoul (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/144,843

(22) Filed: May 15, 2002

(65) Prior Publication Data

US 2002/0172084 A1 Nov. 21, 2002

(30) Foreign Application Priority Data

May 15, 2001 (KR) .................................... P2001-26369

(51) Int. Cl.[7] ................................................. G11C 7/00

(52) U.S. Cl. ..................... 365/200; 365/225.7

(58) Field of Search ................................. 365/200, 198, 365/189.08, 225.7, 230.08, 233.5

(56) References Cited

U.S. PATENT DOCUMENTS 5,841,712 A * 11/1998 Wendell et al. ............. 365/200
6,119,251 A * 9/2000 Cloud et al. ................ 365/201

* cited by examiner

Primary Examiner—Thong Le
(74) Attorney, Agent, or Firm—Birch, Stewart, Kolasch & Birch, LLP

(57) ABSTRACT

A column repair circuit of a semiconductor memory is disclosed, in which a column repair efficiency is increased in a row flexible redundancy structure. A repair circuit for a memory divided into arrays and arranged by row lines and column lines crossing each other, the circuit includes a plurality of column fuse boxes for outputting a redundant column enable signal for repairing a defective line, and an array address inverter corresponding to one of the column fuse boxes for inverting a self-pair signal input thereto and a corresponding array address input thereto, the self-pair signal indicating whether a row repair is performed in a corresponding array or in another array, and for selectively outputting the inverted array address according to the self-pair signal.

20 Claims, 6 Drawing Sheets

COLUMN REPAIR CIRCUIT OF SEMICONDUCTOR MEMORY

RELATED APPLICATION

This application claims the benefit of Korean Patent Application No. P2001-26369 filed on May 15, 2001, under 35 U.S.C. §119, which is hereby incorporated by reference.

BACKGROUND OF THE INVENTION

1. Field of the Invention

The present invention relates to a redundancy circuit of a semiconductor memory, and more particularly, to a column repair circuit of a semiconductor memory capable of increasing its repair yield in a row flexible redundancy structure.

2. Discussion of the Related Art

Generally, in a semiconductor memory, a redundancy circuit and a redundancy memory cell array for repairing a defective memory cell using a redundancy memory cell are provided.

A redundancy operation is performed by separately providing a redundancy memory cell array besides a normal memory cell, by decoding an input address which designates a certain defective memory cell in a normal memory cell array, and then by selecting a redundancy row or a redundancy column connected to the redundancy memory cell.

The redundancy operation is performed by a redundancy decoder. An output signal of the redundancy circuit which programs a defective address determines whether or not a normal decoder or a redundancy decoder is enabled. The redundancy circuit programs the defective address by laser-cutting a fuse provided inside the redundancy circuit according to an address which will be decoded.

A column redundancy circuit has to quickly determine which column to select between a redundancy column and a normal column each time a column address is input. In a semiconductor memory circuit, if an address for designating a defective column is input, the input address is replaced with the address of a redundancy column so as to repair the defective column, and the redundancy column is selected.

A related art column repair circuit of a semiconductor memory will be explained with reference to the accompanying drawings.

FIG. 1 illustrates a schematic view of a general semiconductor memory cell array, and FIG. 2 illustrates a schematic view of a related art column repair. FIG. 3 illustrates a block diagram showing a construction of a related art column fuse box, and FIG. 4 illustrates a schematic view showing a problem at the time of repairing a related art column.

Generally, as shown in FIG. 1, a cell array consists of arrays having a plurality of cells, word lines, and column selective lines. Herein, the word lines and the column selective lines cross each other.

For a column repair of the cell array, as shown in FIG. 2, redundant column lines are formed at margin portions of the array, not at a middle portion of the array. To improve a column repair efficiency in this structure, the entire column selective lines are not replaced, but only the when column selective line(s) corresponding to the failed array are replaced.

That is, as shown in FIG. 2, when a column line (column selective line) YI<0> in an array 1 fails, a redundant column line SYI<0> is selected if the column line YI<0> is selected in a column cycle once the array 1 is selected in a low cycle. In the same manner, when a column line YI<1> in an array 3 fails, a redundant column line SYI<0> is selected if the column line YI<1> is selected in a column cycle once the array 3 is selected in a low cycle. As a result, in the convention art, a plurality of column lines YI<0> . . . YI<n> are replaced with only one redundant column line SYI<0>.

Herein, the number of times that the same redundant column line SYI is used to replace different failed column lines is determined by the number of programming fuse boxes assigned to the redundant column line SYI in case that a column failure occurs in different arrays.

A structure of a related art programming fuse box will now be explained referring to FIG. 3.

As shown in FIG. 3, each of a plurality of column fuse boxes 30 includes an array address fuse and latch box 32 for evaluating and latching a fuse in response to a row cycle timing signal and an array address input thereto; a column address fuse box 33 for outputting a column redundant signal based on an output signal of the corresponding array address fuse and latch box 32, an externally input column cycle timing signal, and a column address.

The column redundant signals output from the respective column address fuse boxes 33 of the column fuse boxes 30 are processed by an OR operation of an OR gate 31. The OR gate 31 finally outputs a redundant column enable signal.

It is known that a row repair algorithm method used in a flexible redundancy algorithm improves a row repair efficiency by replacing a failed word line in one array, not only with a redundant word line in the corresponding array but also with a redundant word line in another array. However, in the case where a column failure in the replaced array (for correcting a word line failure) is detected, there is no method for repairing such column failure. The reason is because the replacement is made only when a failed array address is provided in a row cycle at the time a spare column line is selected to improve the efficiency of a column failure. In a related art row repair method, when a column failure occurs, only a redundant line in a block where the column failure occurs is used to replace the failed column line.

Thus, at this time, there are at least the following problems.

If it is assumed that a number of prepared redundant row lines are 4 per one block, a repair cannot be performed in a case where more than 4 row line failures occur in one array. This inhibits the use of the entire chip.

A flexible redundant structure allows the use of not only the array where a failure occurred but also the use of a redundant line in another array to solve the line failure problems. In this process, an array where the failure occurred is called a "self" array, and another array that provides a redundant line for the self array is called a "pair" array.

FIG. 4 illustrates a schematic view showing a problem at the time of repairing a related art column line, in which a row line having a failure in a self array is replaced with a redundant word line of a pair array. However, if a corresponding column address is selected where a failed column line is found in the pair array, the array address of the self array, instead of the array address of the pair array, is input since the pair array has a failed column line, whereby the failed column line is not replaced.

The above problem occurs even though the redundancy circuit is programmed so that a failed column is to be replaced with a redundant column in the pair array.

SUMMARY OF THE INVENTION

Accordingly, the present invention is directed to a column repair circuit for a semiconductor memory that substantially obviates one or more problems due to limitations and disadvantages of the related art.

An object of the present invention is to provide a column repair circuit of a semiconductor memory which can increase efficiency of a column repair in a row flexible redundancy structure.

Another object of the present invention is to provide a column repair device for a memory which receives information and generates an address of a replaced array when a row repair in the column repair device is replaced not in its array where the failure of a word line occurred but in another array.

According to an aspect of the present invention, when a failure of a column line occurs in a replaced array, an occasion in which a failure occurs again for the replaced word line can be prevented.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a column repair circuit for a semiconductor memory includes a plurality of column fuse boxes for outputting a column redundant signal to repair correspondingly to a redundancy column line included in the respective array; and an address inverter corresponding to the column fuse boxes for inputting and inverting a self pair signal and a corresponding array address, the self pair for checking whether a row repair is performed in a corresponding array or in another array, the address inverter then for coding and outputting an address of a replaced array in case that the row repair is replaced in another array.

In another aspect of the present invention, a column repair circuit of a semiconductor memory includes an array address inverter for input-inverting a self-pair signal and an array address, the self-pair signal for checking whether a repair method is a self array or a pair array in a row repair operation, the array address inverter then for outputting a coded array address, that is, a replaced array address, in case that a row repair is replaced not in its array where a failure of a word line occurs but in another array; an array address fuse and a latch box for evaluating and latching a fuse by inputting a row cycle timing signal and the coded array address; and a column fuse box corresponding to the array address inverter, the column fuse box including a column address fuse box for outputting a column redundant signal by output signals from the array address fuse and the latch box, an external input column cycle timing signal, and a column address.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 5:
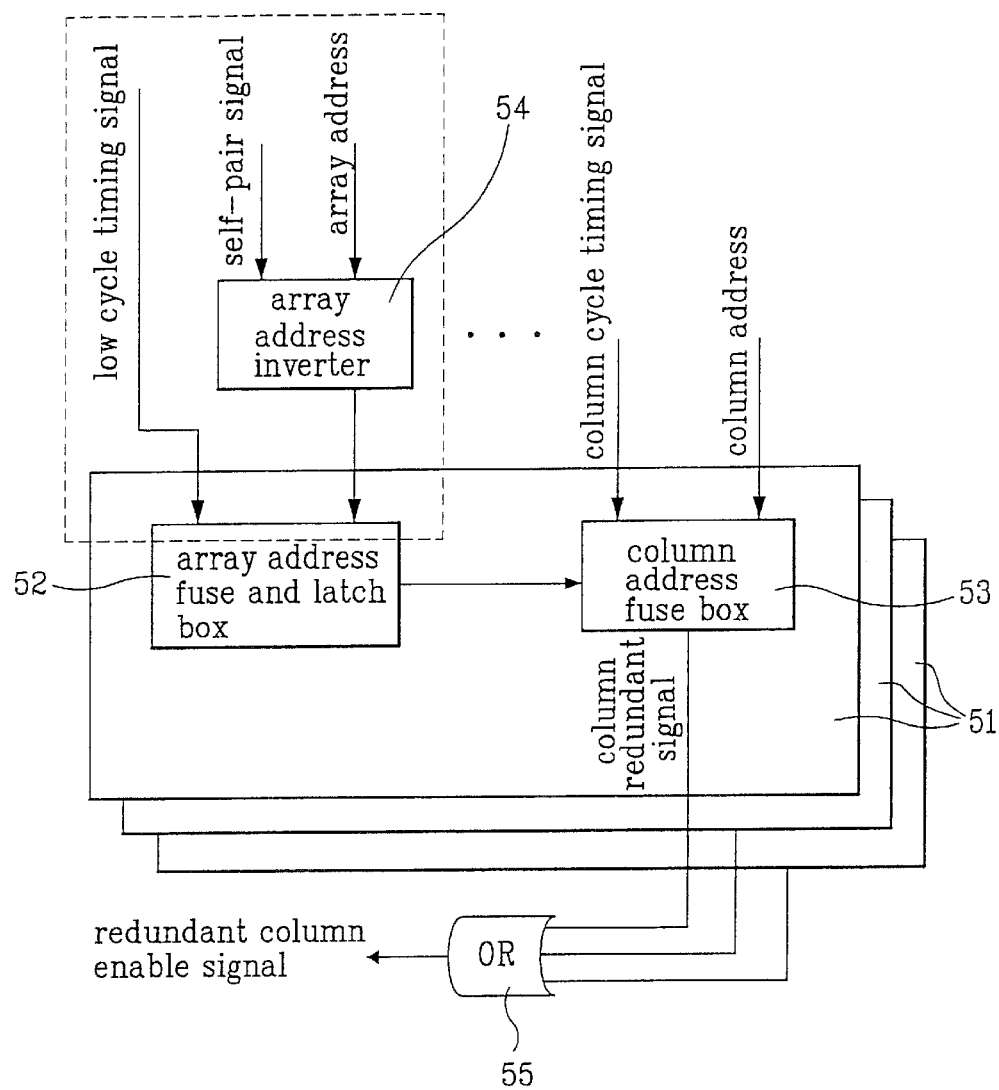
FIG. 5 illustrates a schematic view showing a structure of a column repair circuit for a semiconductor memory according to an embodiment of the present invention.
Figure 6:
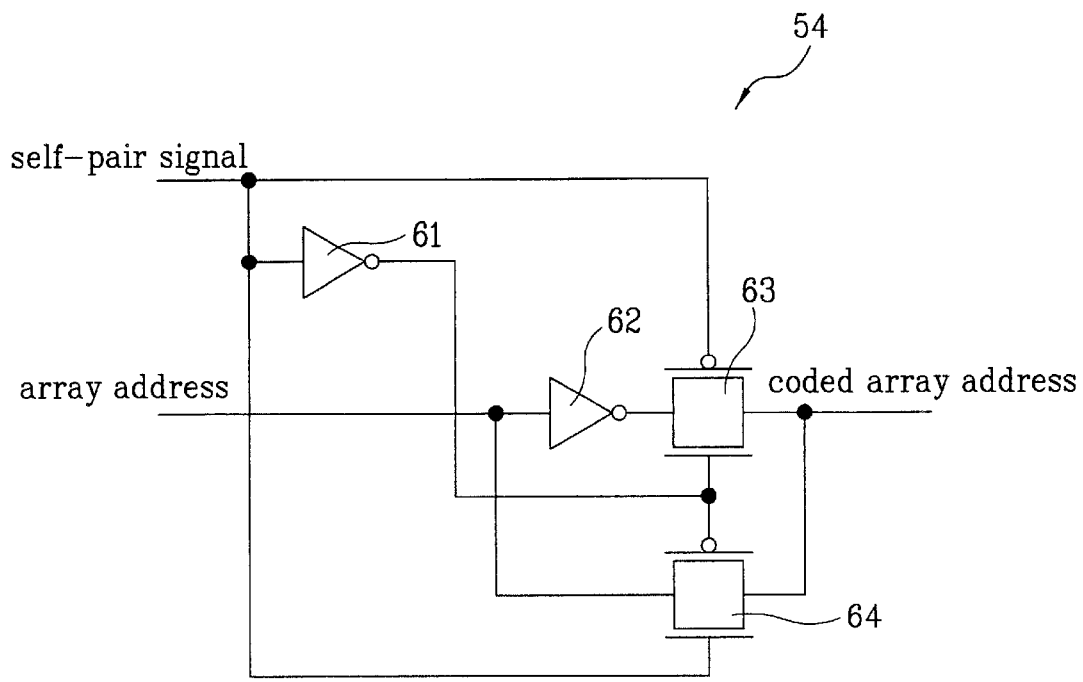
FIG. 6 illustrates a schematic view of an array address inverter of the column repair circuit in FIG. 5 according to an embodiment of the present invention.

FIG. 5 illustrates a schematic view showing a structure of a column repair circuit of a semiconductor memory according to an embodiment of the present invention, and FIG. 6 illustrates a schematic view of an array address inverter 54 of the column repair circuit in FIG. 5 according to an embodiment of the present invention.

As shown in FIG. 5, in a column repair circuit for a semiconductor memory or other type of array memory according to the present invention, one array address inverter 54 is provided per column fuse box 51 so as to detect a row repair in the corresponding column fuse and to invert an input array address whenever a row repair is performed using a pair array. In addition, the column repair circuit includes a plurality of column fuse boxes 51 each having a column address fuse box 53 and an array address and latch box 52.

In the present invention, a "self-pair" signal is determined according to the result of an array failure detection. A high level or low level self-pair signal is generated and input to the array address inverter depending whether a repair mode is a self array repair or a pair array repair. The self-pair signal indicates the status of a repair line at the time of programming a repair and performs a fuse programming. For example, when a person performing a repair (e.g., a programmer) replaces a repair line of a self array, the person may cut a programmed fuse to generate a low level self-pair signal. However, when the repairer replaces a failed line with a redundant line in a pair array, a high level self-pair signal may be generated. Obviously, other variations are possible and contemplated as part of the present invention. A self-pair signal is generated for each array.

Whether or not a corresponding fuse is cut is detected in a row active cycle according to whether or not a fuse is cut, and then a proper pulse (e.g., a self-pair signal) is generated.

Figure 1:
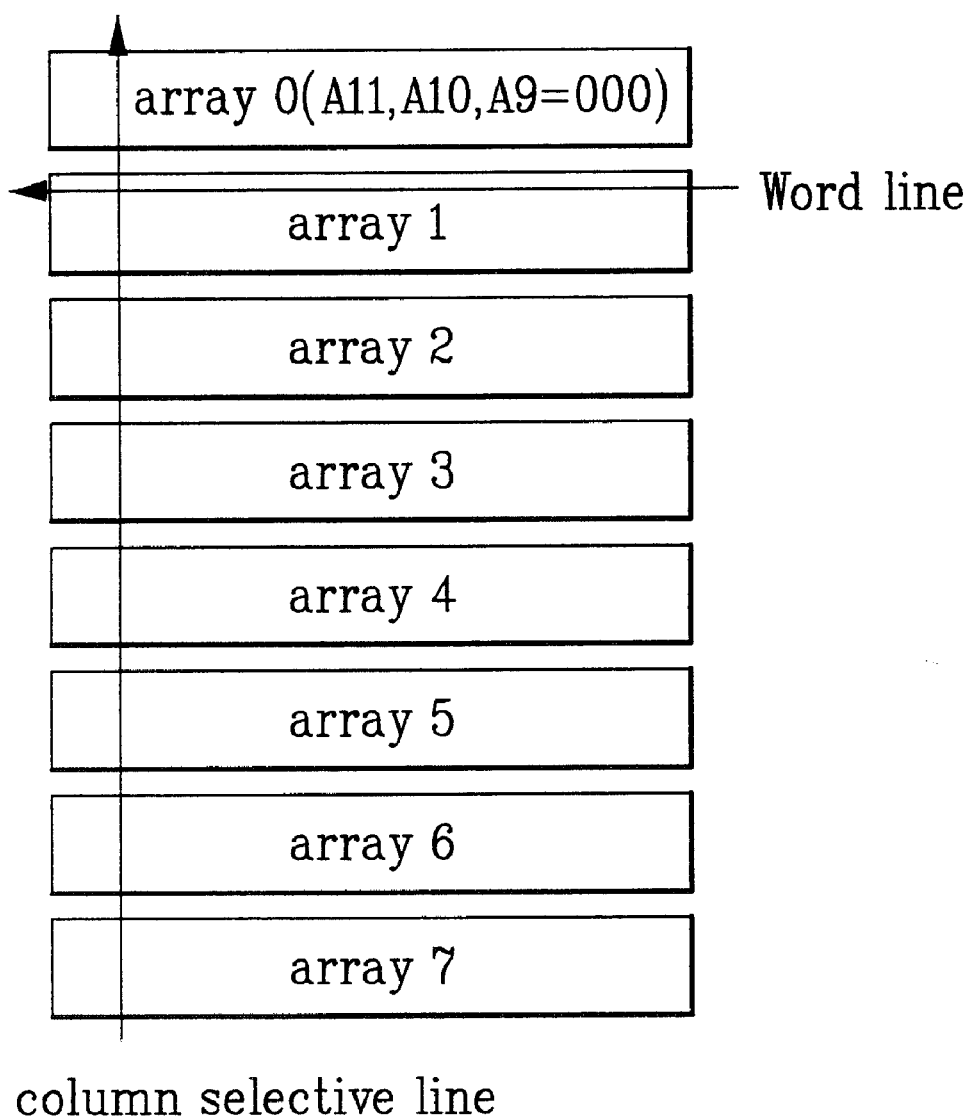
FIG. 1 illustrates a schematic view of a general semiconductor memory cell array.
Figure 2:
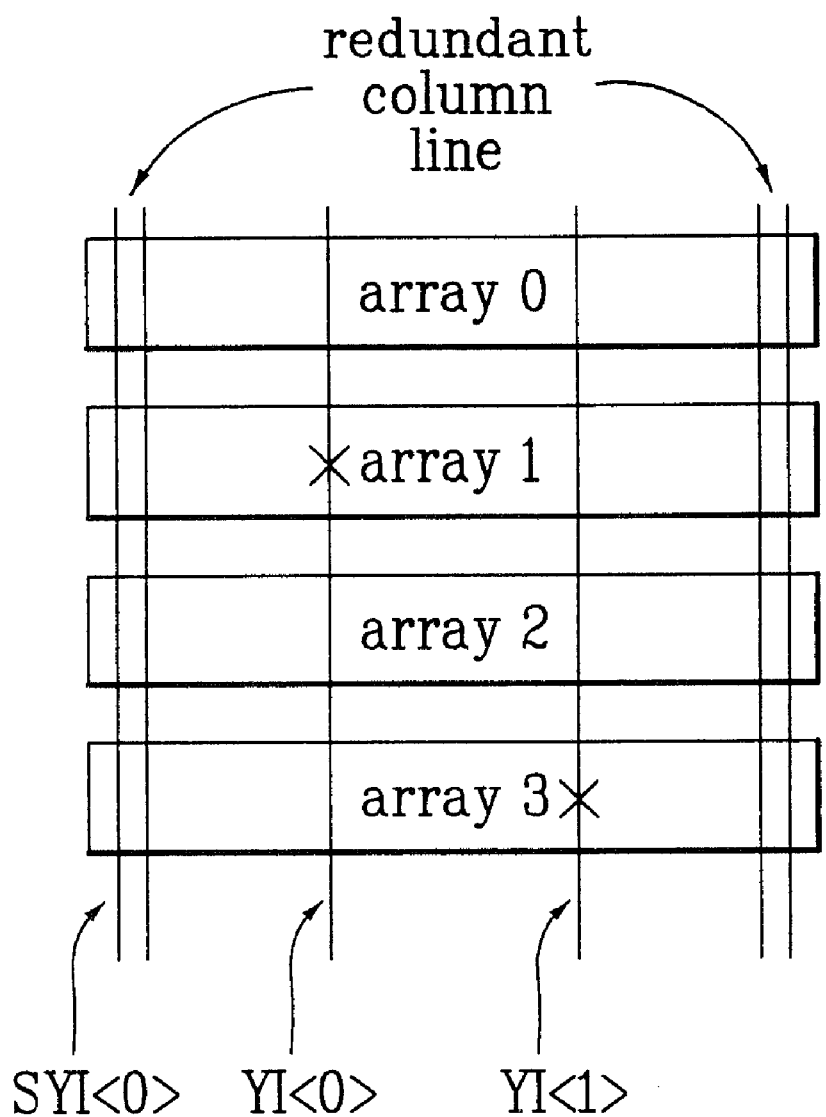
FIG. 2 illustrates a schematic view of a related art column repair.
Figure 3:
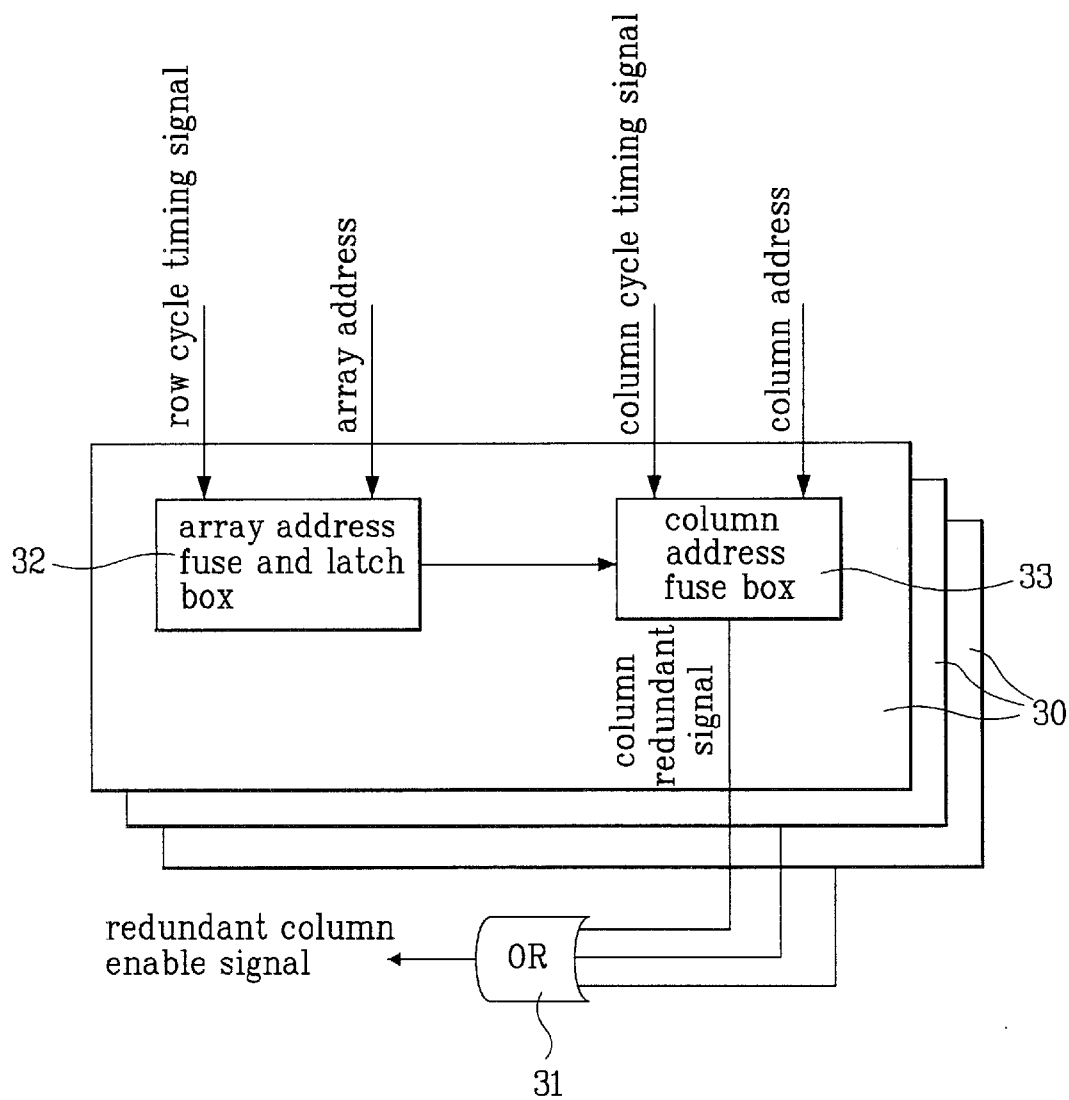
FIG. 3 illustrates a block diagram showing a construction of a related art column fuse box.
Figure 4:
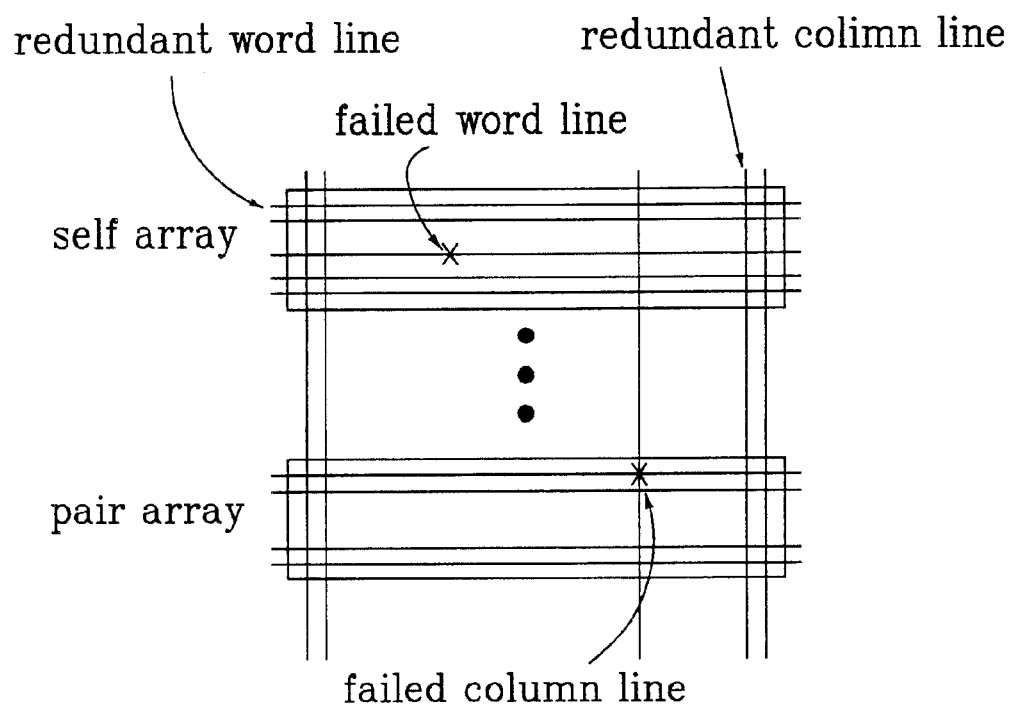
FIG. 4 illustrates a schematic view showing a problem at the time of repairing a related art column.

The array address inverter 54 inverts an array address input thereto and selectively outputs the inverted array address depending on the logic level of the self-pair signal. Then this array address (whether it be an inverted array address or a normal array address) with a low cycle timing signal are processed by the array address fuse and latch box 52 in the same manner as the array address fuse and latch box 32 in FIG. 3 of the related art. Then the column address fuse box 53 generates a column redundant signal based the output of the box 52, a column cycle timing signal and a column address in the same manner as the fuse box 33 of the related art in FIG. 3.

Then, column redundant signals from the respective column address fuse boxes 53 of the column fuse boxes 51 are ORed by an OR gate 55 to finally output a redundant column enable signal according to the present invention.

A detailed construction of the array address inverter 54 according to an embodiment of the present invention is explained referring to FIG. 6.

As shown in FIG. 6, the array address inverter 54 includes a first inverter 61 for inverting a self-pair signal input thereto to generate an inversed self-pair signal; a second inverter 62 for inverting an array address or address bits input thereto to generate an inverted array address; a first switch or transmission gate 63 for selectively outputting the inverted array address based on the self-pair signal; and a second switch or transmission gate 64 for selectively outputting the normal (non-inverted) array address based on the self-pair signal. For example, if the self-pair signal is at a high level, then the first transmission gate 64 is switched on to output the inverted address bit. If the self-pair signal is at a low level, then the second transmission gate is switched on to output the normal (non-inverted) address bit instead of the inverted address bit. In this manner the first and second transmission gates 63 and 64 output a coded array address.

The array address inverter 54 outputs an array address, that is, a coded array address, in case that a row repair is replaced with a redundant line not in its array (self array) where the failure occurred but in another array (pair array). For example, assume that a self-pair signal at a logic high state indicates a self repair and a self-pair signal at a logic low state indicates a pair repair. In this case, the array address inverter 54 outputs a coded array address as follows. When a failure of an array 0 (self array) is replaced with a redundant word line of an array 2 (pair array), the result is a pair repair. According to this scenario, a self-pair signal at a logic low state is generated and input for an array address bit corresponding to the self and pair arrays (e.g., bit A10 for the array address bits A11, A10 and A9). The input array address bit A10 is then inverted by the array address inverter 54 which is input to an appropriate array fuse box.

A flexible redundant algorithm which adopts the column repair circuit according to the present invention can be realized by the following two methods.

First, a defective word line of an array is replaced by a redundant word line in that array, or by a redundant word line in a special array composed of only redundant word lines.

Second, a defective word line of an array is replaced by a redundant word line in that array or by a redundant word line in another array having word lines and redundant word lines.

The above second method will now be explained in more detail. When a failed word line in an array is replaced by one or more redundant word lines of that array, an array address in which a word line is enabled is the same as a substantial array address. However, when failures requiring a replacement of word lines in one array are generated more times than a number of redundant word lines present in that one array, spare redundant word lines in another array have to be used.

At this time, methods for selecting another array according to an embodiment of the present invention include (1) a method for programming another array address selected at the time of programming a fuse, and (2) a method for selecting previously coupled arrays by a set rule.

In the case (1) above, the number of fuses that have to be programmed is increased, and this increases the size of the fuse box. In the case (2) above, only one fuse for checking whether a failed word line in an array is replaced by a redundant word line in that array or in a previously coupled array is used, thereby simplifying the redundancy circuitry and/or device.

A rule for selecting a pair array according to an embodiment of the present invention will be explained by taking an example of 128M DDR SDRAM having 8 arrays. In this example, three array address bits A11, A10, and A9 are used to select one of the 8 arrays. An array 0 will be selected if the array address bits A11, A10, A9 are 0,0,0. An array 1 will be selected if the array address bits A11, A10, A9 are 001. In this manner, an array 7 will be selected if the array address bits A11, A10 A9 are 111.

Here, a pair array corresponds an array 2 to an array 0, an array 3 to an array 1, an array 6 to an array 4, and an array 7 to an array 5.

In this rule, if the array address bit A10 is inverted in case that a pair repair is selected, the array address bit A10 becomes an array address of a pair array for the defective array. For example, when a failed word line in the array 0 is replaced by a redundant word line in the array 2, the original array address satisfies that the array address bits A11, A10, A9 are equal to 0,0,0. Accordingly, if the address bit A10 is inverted (e.g. from logic "0" to "1"), the address bits become 010, thereby selecting the array 2 as the pair array.

If an array address generated by this method is used as an array address in a column repair circuit, a programming or a replacement is possible in case that a column is failed in a replaced pair array.

The present invention enables a repair by adding a logic, which is applied not only in a column repair but also in a row repair.

A column repair circuit of a semiconductor memory according to the present invention has at least the following advantages.

Since a column repair is performed by receiving information and by generating an address of a replaced array in case that a row repair in the column repair circuit is replaced with a redundant line not in its array where failure of the word line occurred but with a redundant line in another array, an efficient repair is performed even though a failed column exists in the pair array. This improves the yield of the semiconductor memory, thereby reducing the fabricating cost.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. A repair circuit for a memory divided into arrays and arranged by row lines and column lines crossing each other, the repair circuit comprising:
   a plurality of column fuse boxes for outputting a redundant column enable signal for repairing a defective line; and
   an array address inverter corresponding to one of the column fuse boxes for inverting a self-pair signal input thereto and a corresponding array address input thereto, and for selectively outputting the inverted array address according to the self-pair signal, the self-pair signal indicating whether a row repair is performed in a corresponding array or in another array.

2. The repair circuit as claimed in claim 1, wherein the array address inverter includes:
   a first inverter for inverting the input self-pair signal;
   a second inverter for inverting the input array address;

a first switch for selectively outputting the inverted array address based on the input self-pair signal and the inverted self-pair signal; and a second switch for selectively outputting the input array address based on the input self-pair signal and the inverted self-pair signal.

3. The repair circuit as claimed in claim 1, wherein each of the column fuse boxes includes:

an array address fuse and latch box for latching a fuse based on a coded array address from the array address inverter, and a row cycle timing signal; and a column address fuse box for outputting a column redundant signal based on an output signal from the array address fuse and latch box, an externally input column cycle timing signal, and a column address.

4. The repair circuit as claimed in claim 1, further comprising:

a column enable signal output unit performing an OR operation on the column redundant signals output from the respective column fuse boxes to output the redundant column enable signal.

5. The repair circuit as claimed in claim 1, wherein the self-pair signal indicates whether a repair mode is a self array repair or a pair array repair, and is generated in a row active cycle according to whether or not a fuse cutting of a programming made by dividing a position of a repair line is performed.

6. The repair circuit as claimed in claim 2, wherein the first and second switches are transmission gates.

7. The repair circuit as claimed in claim 1, wherein the array address inverter includes:

inverting means for inverting the input self-pair signal and the input array address; and switch means for selectively outputting either the inverted array address or the input array address based on the input self-pair signal and the inverted self-pair signal.

8. A repair circuit for a memory, comprising:

a plurality of column fuse boxes for outputting a redundant column enable signal for repairing a defective line, each of the column fuse boxes including, an array address fuse and latch box for latching a fuse based on a row cycle timing signal and a coded array address, and a column address fuse box for outputting a column redundant signal based on an output signal from the array address fuse and latch box, an externally input column cycle timing signal and a column address;

a plurality of array address inverters each corresponding to one of the column fuse boxes, each of the array address inverters inverting a self-pair signal input thereto and a corresponding array address input thereto, and selectively outputting the inverted array address as part of the coded array address according to the self-repair signal, the self-pair signal indicating whether a row repair is performed in a corresponding array or in another array; and a column enable signal outputting unit for processing the column redundant signals from the column address fuse boxes and thereby outputting the redundant column enable signal.

9. The repair circuit as claimed in claim 8, wherein each of the array address inverters includes:

a first inverter for inverting the input self-pair signal;

a second inverter for inverting the input array address;

a first switch for selectively outputting the inverted array address based on the input self-pair signal and the inverted self-pair signal; and a second switch for selectively outputting the input array address based the input self-pair signal and the inverted self-pair signal.

10. The repair circuit as claimed in claim 8, wherein the column enable signal outputting unit includes an OR gate to perform an OR-operation on the column redundant signals output from the column address fuse boxes.

11. The repair circuit as claimed in claim 8, wherein the self-pair signal is generated in a row active cycle according to whether or not a fuse cutting of a programming made by dividing a position of a repair line is performed.

12. The repair circuit as claimed in claim 9, wherein the first and second switches are transmission gates.

13. A device for repairing a memory, the device a plurality of fuse sections for outputting a redundant line enable signal for repairing a defective area of the memory; and at least one array address inverter corresponding to one of the fuse sections, the array address inverter inverting a self-pair signal input thereto and a corresponding array address input thereto and selectively outputting the inverted array address or the input address according to the self-pair signal, to the corresponding one of the fuse sections.

14. The device as claimed in claim 13, wherein the self-pair signal indicates whether a row repair is performed in a corresponding array or in another array and the device repairs a column line in the memory.

15. The device as claimed in claim 13, wherein the array address inverter includes:

a first inverter for inverting the input self-pair signal;

a second inverter for inverting the input array address;

a first switch for selectively outputting the inverted array address based on the input self-pair signal and the inverted self-pair signal; and a second switch for selectively outputting the input array address based on the input self-pair signal and the inverted self-pair signal.

16. The device as claimed in claim 13, wherein each of the fuse sections includes:

an array address fuse and latch box for latching a fuse based on a coded array address from the array address inverter, and a row cycle timing signal; and a column address fuse box for outputting a column redundant signal based on an output signal from the array address fuse and latch box, an externally input column cycle timing signal, and a column address.

17. The device as claimed in claim 16, further comprising:

a column enable signal output unit performing an OR operation on the column redundant signals output from the respective column address fuse boxes to output the redundant line enable signal.

18. The device as claimed in claim 13, wherein the self-pair signal is generated in a row active cycle according to whether or not a fuse cutting of a programming made by dividing a position of a repair line is performed.

19. The device as claimed in claim 15, wherein the first and second switches are transmission gates.

20. The device as claimed in claim 13, wherein the array address inverter includes:

inverting means for inverting the input self-pair signal and the input array address; and switch means for selectively outputting either the inverted array address or the input array address based on the input self-pair signal and the inverted self-pair signal.

* * * * *